US006670271B1

United States Patent
Subramanian et al.

(10) Patent No.: US 6,670,271 B1
(45) Date of Patent: Dec. 30, 2003

(54) GROWING A DUAL DAMASCENE STRUCTURE USING A COPPER SEED LAYER AND A DAMASCENE RESIST STRUCTURE

(75) Inventors: Ramkumar Subramanian, San Jose, CA (US); Michael K. Templeton, Atherton, CA (US); Bhanwar Singh, Morgan Hill, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 65 days.

(21) Appl. No.: 10/052,146

(22) Filed: Jan. 17, 2002

(51) Int. Cl.[7] .............................................. H01L 21/44
(52) U.S. Cl. ........................ 438/687; 438/584; 438/618; 438/622; 438/623; 438/624; 438/636; 438/637; 438/638; 438/642; 438/733; 438/736
(58) Field of Search ................................. 438/584, 618, 438/622.4, 636.8, 642, 687, 733, 736

(56) References Cited

U.S. PATENT DOCUMENTS

| 5,821,169 A | 10/1998 | Nguyyen et al. ........... 438/736 |
| 5,877,075 A | 3/1999 | Dai et al. ................... 438/597 |
| 5,877,076 A | 3/1999 | Dai ............................ 438/597 |
| 6,077,733 A | 6/2000 | Chen et al. ................. 438/182 |
| 6,174,818 B1 * | 1/2001 | Tao et al. ................... 438/733 |
| 6,207,546 B1 | 3/2001 | Chen et al. ................ 438/612 |
| 6,287,955 B1 * | 9/2001 | Wang et al. ............... 438/623 |
| 6,455,416 B1 * | 9/2002 | Subramanian et al. ...... 438/636 |

OTHER PUBLICATIONS

Peter van Zant ( "Microchip Fabrication", A Pratical Guide to Semiconductor Processing, 4th ed., pp. 401–403).*

* cited by examiner

Primary Examiner—Kamand Cuneo
Assistant Examiner—Lisa Kilday
(74) Attorney, Agent, or Firm—Amin & Turocy, LLP

(57) ABSTRACT

The present invention involves a method for fabricating interconnecting lines and vias. According to the invention, copper is grown from a seed layer to substantially fill openings in a two layer structure wherein the two layers are independently either dielectric or resist layers. According to one aspect of the invention, first and second resist layers are formed into a dual damascene structure. Copper is grown by plating from the copper seed layer to form copper features that fill the pattern gaps.

30 Claims, 10 Drawing Sheets

GROWING A DUAL DAMASCENE STRUCTURE USING A COPPER SEED LAYER AND A DAMASCENE RESIST STRUCTURE

TECHNICAL FIELD

The present invention generally relates to the fabrication of integrated circuit devices. In particular, the present invention relates to a method for fabricating interconnecting conductive lines and vias in a dual damascene structure.

BACKGROUND

In the semiconductor industry, there is a continuing trend toward higher device densities. To achieve these high densities there have been, and continue to be, efforts toward scaling down (e.g., to submicron levels) device dimensions on semiconductor wafers. In order to accomplish such high device packing density, smaller and smaller features sizes are required. These features sizes include the width and spacing of interconnecting lines, and the spacing and diameter of metal contact vias.

High resolution lithographic processes are employed to define patterns for interconnecting lines and vias. In general, lithography refers to processes for pattern transfer between various media. It is a technique used for integrated circuit fabrication in which a silicon slice, the wafer, is coated uniformly with a radiation-sensitive film, the resist. The film is exposed with a radiation source (such as optical light, x-rays, or an electron beam) that irradiates selected areas of the surface through an intervening master template, the mask, forming a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through the mask causes the image area to become either more or less soluble (depending on the coating) in a particular solvent developer. The more soluble areas are removed in the developing process leaving the less soluble photoresist forming a patterned coating.

A typical method of employing lithography to form metal lines and vias is to form the patterned resist coating over a dielectric layer, such as a layer of silicon oxide. An anisotropic etching process can then be employed to remove the dielectric where it is left exposed by the patterned resist coating. Thereby, the resist pattern is transfer to the dielectric layer. The photoresist is then stripped. A blanket coating of metal is applied over the dielectric layer, filling the gaps in the dielectric pattern. The metal layer is then polished or etched until only the portion of the metal within the pattern gaps remains. This is a single damascene process.

Where multilevel interconnections are desired, the single damascene process can be repeated. However, an improvement is a dual damascene process where two interconnect layers are formed at once. For example a layer of conductive vias and an overlying layer of conductive wiring can be formed simultaneously. A dual damascene process generally involves fewer steps than two single damascene processes. In addition, the dual damascene process eliminates the interface between the two layers.

In a conventional dual damascene process, an insulating layer is coated with a photoresist that is exposed through a first mask to pattern openings corresponding to vias. Anisotropic etching removes the dielectric beneath the patterned openings, thus transferring the via pattern into the dielectric layer. The photoresist is then exposed through a second mask with an image pattern corresponding to conductive lines aligned with the via openings. A second anisotropic etching process removes dielectric in a pattern corresponding to the conductive lines. This second etching process is controlled so that only a portion of the dielectric layer is removed where conductive lines are desired. Thus, trenches are formed in the dielectric which can be filled to form the conductive lines. Dielectric remains to insulate the conductive lines from the underlying substrate except where vias, corresponding to the first mask, are formed entirely through the dielectric layer.

A conventional dual damascene process is illustrated in FIGS. 1–3. FIG. 1 is a perspective view illustration of a composite 10 including a dielectric layer 14 formed on a semiconductor substrate 12. A photoresist layer 16 is formed on the dielectric layer 14. The photoresist layer 16 is patterned to form first openings 18. Anisotropic reactive ion etching (RIE) is performed to form vias 20 (FIG. 2) in the dielectric layer 14. Subsequently, the photoresist 16 is exposed through a second mask to form opening 24 corresponding to conductive lines, as illustrated in FIG. 2. RIE is again carried out, this time forming trenches 26 in the dielectric layer 14 as illustrated in FIG. 3. FIG. 3 illustrates the composite 10 after stripping the photoresist 16.

While the conventional dual damascene process is workable, there remains room for improvement. The conventional dual damascene process involves dielectric etching and clean steps that are difficult to engineer; the process contributes significantly to the overall cost of integrated circuit devices; and the dimension of the resulting lines and vias limits the state of the art for integrated circuit devices. Thus, there remains an unmet need for improved processes for forming metal lines and vias.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention involves a method for fabricating interconnecting lines and vias. In a method of the invention, copper is grown from a seed layer to substantially fill openings in a two layer structure wherein the two layers are independently either dielectric or resist layers. According to one aspect of the invention, first and second resist layers are formed into a dual damascene structure. A copper seed layer is provided in the pattern gaps. Copper is grown by plating from the copper seed layer to form copper features that fill the pattern gaps. The resist is stripped, leaving the copper features. The copper features can then be coated with a diffusion barrier layer and a dielectric. Polished can be employed to planarize the dielectric layer and the copper features.

According to another aspect of the invention, a first resist is patterned over a substrate and a first dielectric coating is formed over the patterned first resist. Polishing leaves the first dielectric coating in the inverse pattern image. A second resist layer is formed and patterned over the first dielectric coating. The first patterned resist is stripped either before, during, or after patterning the second resist layer. A second dielectric layer is formed over the second patterned resist and polished to leave the second dielectric in the inverse pattern of the second patterned resist. The resists are stripped and copper features are grown from a copper seed layer within gaps of the first and second dielectric coatings.

According to a further aspect of the invention, a first resist is patterned over a substrate and a first dielectric coating is formed over the patterned resist. Polishing leaves the first dielectric coating in the inverse pattern image. A second resist layer is formed and patterned over the first dielectric coating. The first patterned resist is stripped either before, during, or after patterning the second resist layer. Copper features are grown from a copper seed layer within the gaps of the first dielectric layer and the second patterned resist. The second patterned resist is then stripped and a second dielectric layer is formed over the copper features and the first dielectric layer. Polishing can be employed to planarize the second dielectric layer and the copper features.

The invention provides copper lines and vias in a dual damascene structure without the need for a dielectric or metal etching step. Another benefit of the invention is that lines widths can be increased by trimming the first and/or second layer prior to growing the copper features. Other advantages and novel features of the invention will become apparent from the following detailed description of the invention and the accompanying drawings. The detailed description and drawings provide certain illustrative examples of the invention. These examples are indicative of but a few of the various ways in which the principles of the invention can be employed.

DISCLOSURE OF THE INVENTION

Figure 1:
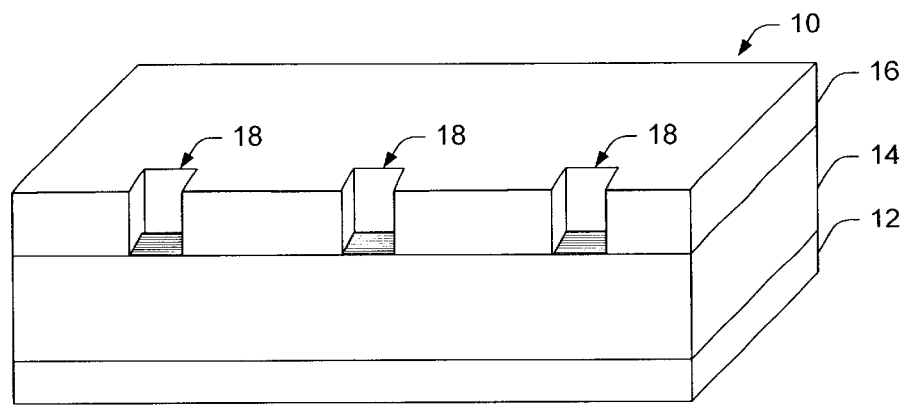
FIG. 1 is a schematic illustration of an intermediate stage in a prior art process of for forming a dual damascene structure.
Figure 2:
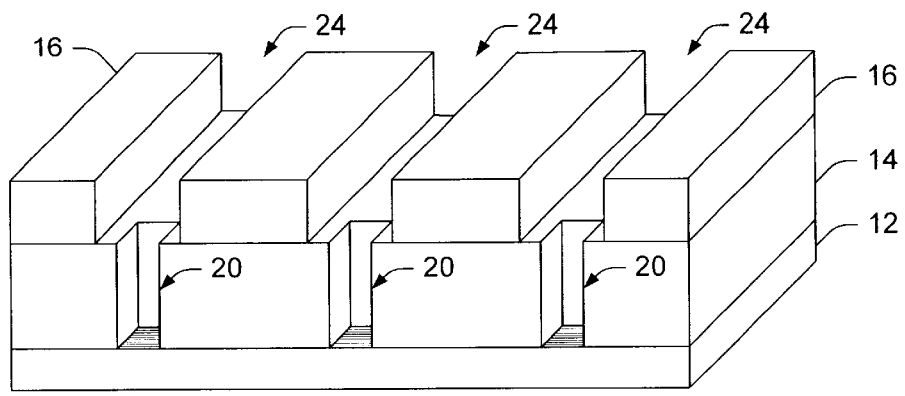
FIG. 2 is a schematic Illustration after further processing of the structure of FIG. 1.
Figure 3:
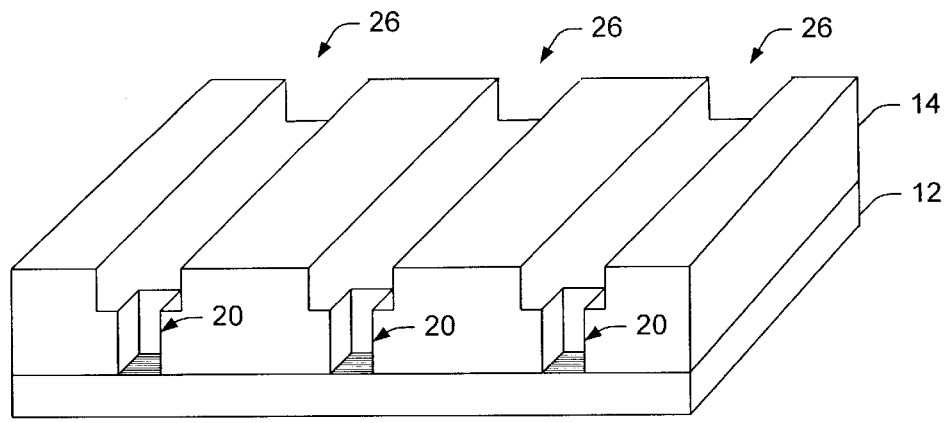
FIG. 3 is a schematic illustration after further processing of the structure in FIG. 2.
Figure 4:
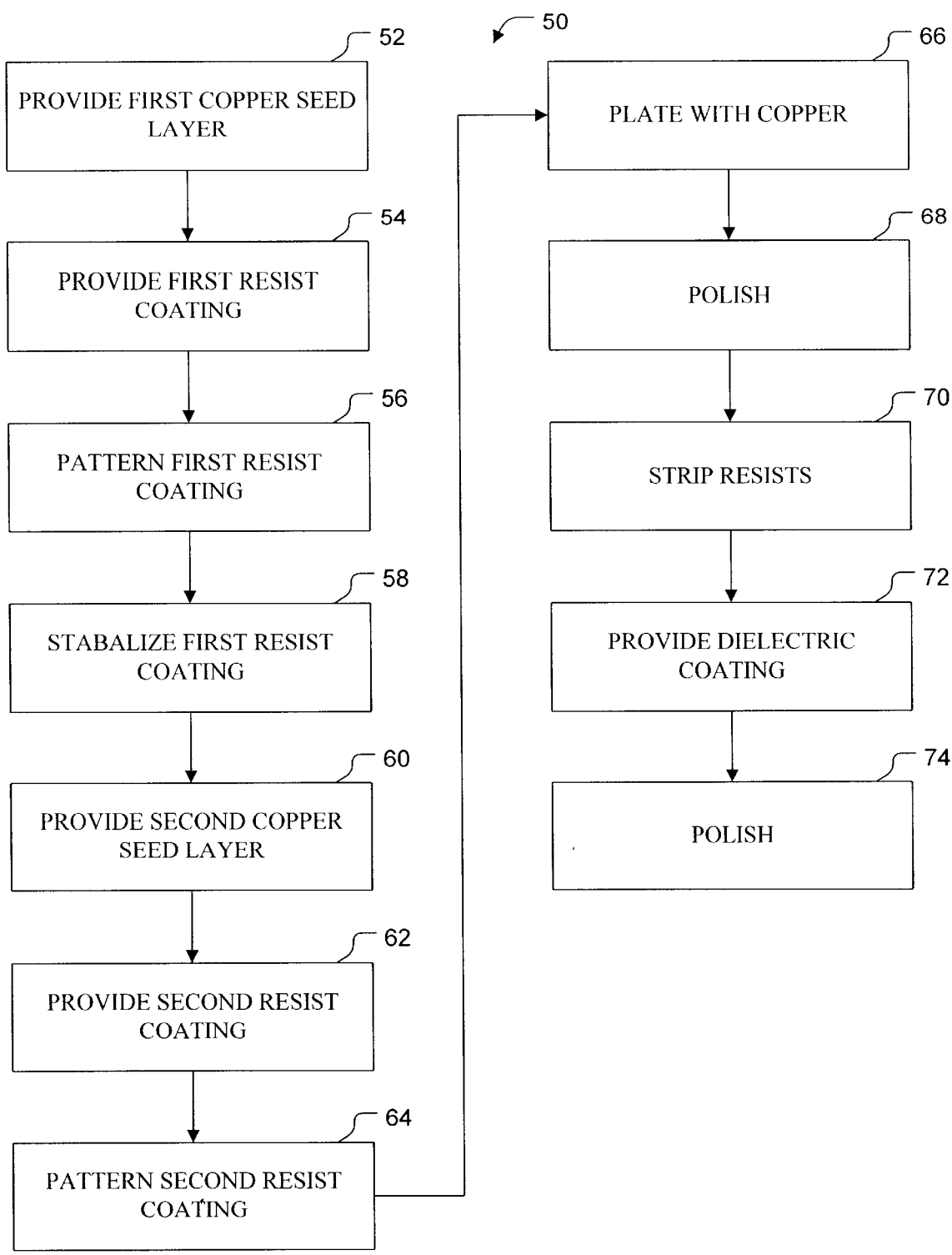
FIG. 4 is a flow chart of a process for forming copper features according to one aspect of the present invention.

FIGS. 4 is a flow chart of a process 50 for forming copper features on a semiconductor substrate according to one aspect of the present invention. The copper features can provide a two layer interconnect such as provided by a dual damascene process. In process 50, a copper seed layer is formed over the semiconductor substrate. A first patterned resist is formed over the copper seed layer, whereby the copper seed is only exposed within gaps or openings defined by the first patterned resist. A second copper seed layer is provided over the first patterned resist. A second resist is coated over the substrate, including the first patterned resist. The second coating is patterned to reveal the openings in the first patterned resist and a portion of the first patterned resist. Copper is grown by plating from the seed layers where they are exposed within openings defined by the first and second patterned resists. The resists are stripped and the copper features are coated with a dielectric. Polishing can be used to planarize the surface and exposes a portion of the copper features. The process provides the copper features according to the patterns of the first and second patterned resists. The spaces between features are filled with dielectric. The entire process can be carried out without the need for a dielectric or metal etching step.

A semiconductor substrate includes a semiconductor, typically silicon. Other examples of semiconductors include GaAs and InP. In addition to a semiconducting material, the semiconductor substrate may include various elements and/or layers; including metal layers, barrier layers, dielectric layers, device structures, active elements and passive elements including silicon gates, word lines, source regions, drain regions, bit lines, bases emitters, collectors, conductive lines, conductive via, etc.

Process 50 optionally includes act 52, which is depositing a first copper seed layer over the semiconductor substrate. A copper seed layer contains copper. The copper can be unalloyed or can be in the form of an alloy with one or more suitable alloying elements, such as Mg, Al, Zn, Zr, Sn, Ni, Pd, Ag, or Au. A seed layer can be deposited by any suitable means, including, for example, sputter deposition or CVD deposition. The thickness and coverage of the copper seed layer depends on the plating process to be employed. For electroplating, the seed layer is generally continuous. For electroless plating, a seed layer less than about 100 Å can be sufficient, and the layer can be composed of islets of metal.

Act 54 is coating the semiconductor substrate and the first copper seed layer, where provided, with a first resist. The resist material may be organic or inorganic. The resist may be a photoresist responsive to visible light, ultraviolet light, or x-rays, or the resist may be an electron beam resist or an ion beam resist. A positive or negative tone resist can be used. Examples of resists include novalacs, poly-t-butoxycarbonyloxystyrenes (PBOCOS), poly-methylmethacrylates (PMMA), poly(olephin sulfones) (POS), and poly(methyl isophenyl ketones) (PMIPK). The resist may be chemically amplified. Resists are commercially available from a number of sources, including Shipley Company, Kodak, Hoechst Celanese Corporation, Clariant, JSR Microelectronics, Hunt, Arch Chemical, Aquamer, and Brewer.

The first resist may be coated by any suitable means. Spin coating, dip coating, or vapor deposition may be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the semiconductor substrate surface.

In one embodiment, the first resist coating is from about 200 Å to about 20,000 Å thick. In another embodiment, the resist coating is from about 500 Å to about 10,000 Å thick. The thickness depends on the desired copper feature size. Depending on the application suitable thicknesses make be in the range from about 1,800 Å to about 4,000 Å; from about 4,500 Å to about 6,000 A; from about 6,500 Å to about 8,000 Å; or from about 8,500 Å to about 10,000 Å, for example. Similar options arc available for the second resist coating.

Figure 5:
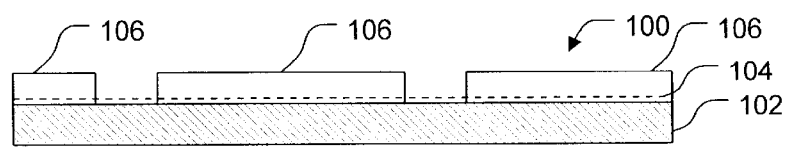
FIG. 5 illustrates a first patterned resist and a copper seed layer over a semiconductor substrate.

Act 56 is patterning the first resist coating. This involves exposing the first resist to actinic radiation through a patterned mask or reticle and developing the resist with a suitable solvent developer. Patterning the first resist coating creates openings through which the substrate and, where provided, the first copper seed layer are exposed. FIG. 5 illustrates a device 100 having the resulting structure. Device 100 includes substrate 102, copper seed layer 104, and patterned resist coating 106.

In addition to conventional patterning, the resist can be trimmed. The density of interconnecting lines is generally limited by the lithographic process. At the limit or resolution, the spacing between lines is approximately equal to the width of the lines. Trimming can increase the widths of the lines by reducing the spacing between lines. Thus, trimming increases line widths and line conductivities while maintaining the maximum line density enabled by a lithographic process.

Trimming is generally carried out by etching. Etching can involve a physical process, a chemical process, or combined physical and chemical process. Physical processes can include glow-discharge sputtering or ion beam milling. Physical processes are comparatively non-selective as to the type of material removed. Combined physical and chemical process include reactive ion etching (RIE) and plasma etching. Examples of gases that may be used in reactive ion or plasma etching include oxygen, fluorine compounds, such as carbon tetrafluoride, chlorine compounds, such as $Cl_2$, hydrogen, inert gases, and combinations of the foregoing. Chemical processes include wet etching. For example, an acid, a base, or a solvent can be employed, depending on the nature of the resist coating. Acids that may be used include hydrofluoric acid, hydrobromic acid, nitric acid, phosphoric acid or acetic acid. Bases that may be used include hydroxides such as sodium hydroxide, ammonium hydroxide, and potassium hydroxide. Solvents may be polar, such as water, or non-polar, such as xylene or cellusolve, or of intermediate polarity, such as alcohols such as methanol or ethanol. Where a first copper seed layer is provided in process 50, the etching method is selected to avoid substantially removing the exposed portion of the copper seed layer.

In one embodiment, trimming increases a line width by at least about 10%. In another embodiment, trimming increases a line width by at least about 25%. In a further embodiment, trimming increases a line width by at least about 50%.

Act 58 is an optional step of stabilizing the patterned first resist. Stabilizing can be desirable to mitigate or avoid damage to the first patterned resist during subsequent processing steps. Stabilizing a resist generally involves cross-linking, which can be induced, for example, thermally or with actinic radiation, depending on the type of the resist.

Act 60 is another optional step of providing a second copper seed layer. Where the second cooper seed layer adequately covers the substrate exposed by the openings in the first pattern resist coating, act 52, providing the first copper seed layer, is generally omitted. The second copper seed layer is provided in a manner similar to the first copper seed layer.

Figure 6:
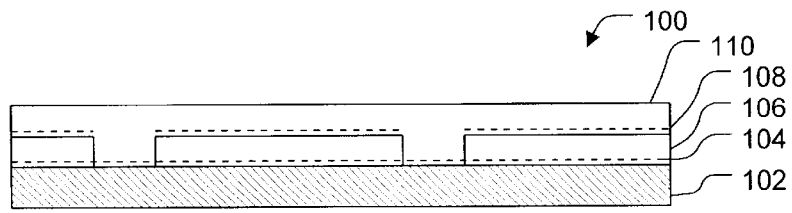
FIG. 6 illustrates the structure of FIG. 5 after forming a second copper seed layer and coating with a second resist.

Act 62 is providing a second resist coating. Where the first patterned resist coating is stabilized, the second resist coating can be of the same type as the first patterned resist coating. Otherwise, a different resist material is used. In any case, the second resist coating is selected such that solvents can be found for applying and patterning the second resist coating while not substantially damaging the first patterned resist coating. Providing the second patterned resist coating results in a structure such as illustrated in FIG. 6. FIG. 6 illustrates device 100 wherein a second resist coating 110 fills the openings defined by the first patterned resist coating 106 and covers the first patterned resist coating 106.

Figure 7:
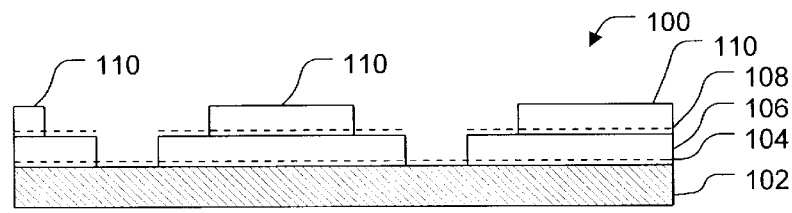
FIG. 7 illustrates the structure of FIG. 6 after patterning the second resist.

Act 64 is patterning the second resist coating. Patterning exposes openings in the first resist coating and a portion of the first resist coating, resulting in a structure such as that illustrated in FIG. 7. Trimming can also be carried out at this stage of the process. A trimming step at this point can increase line widths defined by openings in the first and or second patterned resist coatings.

Figure 8:
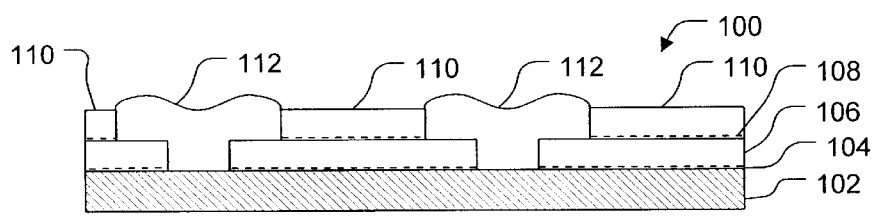
FIG. 8 illustrates the structure of FIG. 7 after platting with copper.
Figure 13:
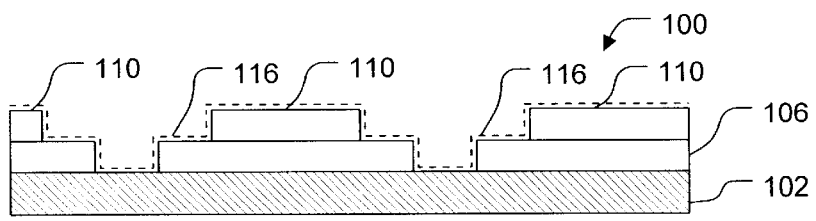
FIG. 13 illustrates a copper seed layer formed over first and second patterned resist coatings.
Figure 14:
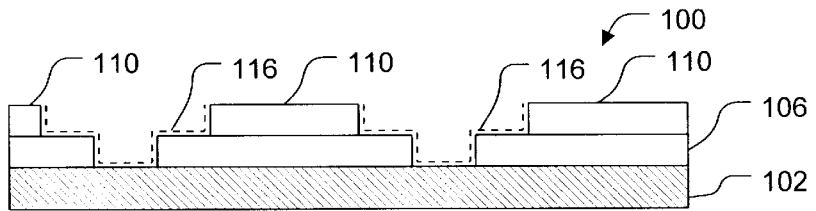
FIG. 14 illustrates the structure of FIG. 13 after removing copper seed outside the pattern openings.

Act 66 is plating with copper. Plating can involve electroless or electroplating. Electroless plating involves controlled autocatalytic deposition by the interaction of the seed layer or deposited copper with a metal salt and a chemical reducing agent that are in solution. Electroplating involves reduction of metal ions in a plating solution by supplying electrons from an external source to an electrode that includes the seed layer and copper deposited thereon. In either case, copper features grow from the exposed portions of the copper seed layers to provide a structure such as illustrated in FIG. 8, which shows device 100 with copper features 112.

Where copper seed layers are not provided in either act 52 or act 56, a copper seed layer can be deposited over the substrate and the first and second patterned resist coatings prior to plating with copper, resulting in a structure such as that illustrated by FIG. 13, wherein copper seed layer 116 is formed over substrate 102, first patterned resist 106, and second patterned resist 112. Such a copper seed layer is removed from the upper surface of the second patterned resist, whereby the copper seed layer is restricted to openings defined by the first and second patterned resist coatings as illustrated in FIG. 14. The copper seed layer can be removed from upper surface of the second patterned resist by any suitable means that leaves the copper seed layer within the pattern gaps. For example, a reactive ion etching process can be employed with ions incident at an angle that is sharply oblique with respect to the surface. A polishing process, such as mechanical or chemical mechanical polishing, can also be employed.

Figure 9:
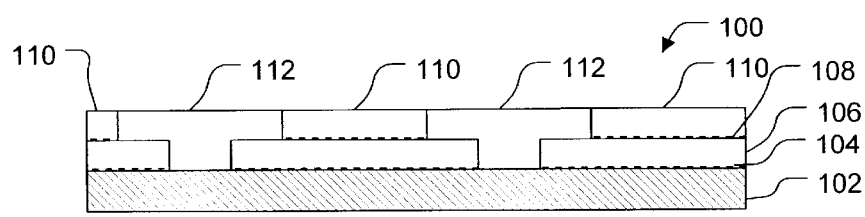
FIG. 9 illustrates the structure of FIG. 8 after polishing.

Act 68 is polishing, which is optional at this stage. As illustrated in FIG. 9, polishing can be employed to planarize the second patterned resist coating and the copper features. To the extent that copper features 112 grew over and outside the second patterned resist coating 110 in act 66, polishing removes the excess copper to limit the copper features to the pattern defined by the first and second resists.

Polishing can be purely mechanical or chemical mechanical. Mechanical polishing involves contact the surface with a polishing pad. Chemical mechanical polishing uses a material, often referred to as a slurry, that does not rapidly dissolve the material being removed, but modifies its chemical bonding sufficiently to facilitate mechanical removal with a polishing pad.

Figure 10:
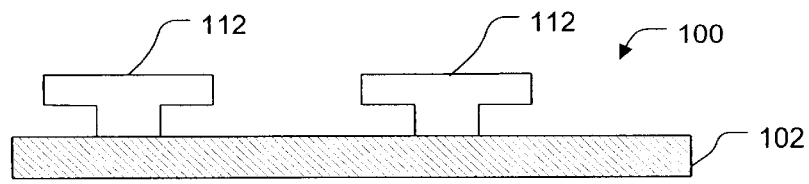
FIG. 10 illustrates the structure of FIG. 9 after stripping the resists.

Act 70 is stripping the resists. Any suitable stripping agent can be employed. The resulting structure, in which copper features 112 are exposed, is illustrated in FIG. 10. A portion of copper seed layer 104 may remain on substrate 102 after stripping the resist. Particularly where copper seed layer 104 is a continuous layer, it can be desirable to remove this layer. The copper seed layer 104 can be removed by a mild and/or brief wet etching processing, for example.

Plating, and other actions aside from trimming that take place prior to stripping the resists, are carried out with appropriate consideration for the chemical and physical stability of the resists. For example, the resists are generally not exposed to temperatures in excess of about 250° C. Preferably, the resists are not exposed to temperatures in excess of about 200° C. Electroless plating can affect resists that are low in chemical stability, therefore, relatively chemically inert resists are desirable during electroless plating. Optionally, the chemical stability of the resists can be increased prior to electroless plating, by cross-linking for example.

After stripping the resists, the copper features are optionally coated with a diffusion barrier material. A diffusion barrier can be desirable to prevent copper from diffusing into a dielectric subsequently formed adjacent the copper. Suitable diffusion barrier materials include tantalum (Ta), tantalum nitride (TaN), titanium (Ti), titanium tungsten (TiW), and silicon nitride ($Si_3N_4$). The copper features can be coated with the diffusion barrier material by any suitable method, CVD), for example.

Figure 11:
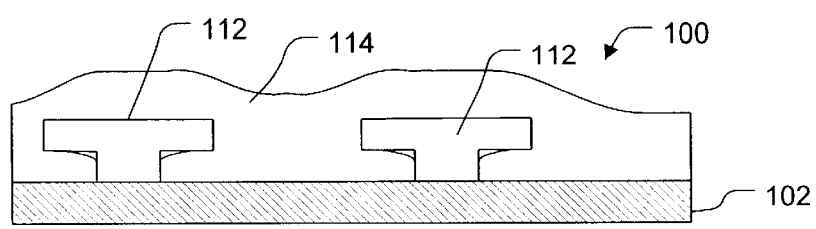
FIG. 11 illustrates the structure of FIG. 10 after coating with a dielectric.

Act 72 is coating the semiconductor substrate and copper features with a dielectric. FIG. 11 illustrates the resulting structure, in which a dielectric 114 covers the copper feature 112. Examples of dielectrics include silicon nitride, tetraethyl orthosilicate (TEOS), BPTEOS, flouronated silicate glass (FSG), borophosphosilicate glass (BPSG), PSG, silicon dioxide, and silicon oxynitride. The dielectric may be coated by any suitable process. Depending on the dielectric, suitable processes include CVD, plasma enhance CVD, and spin coating.

Figure 12:
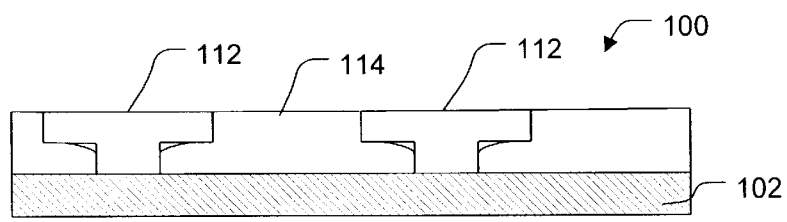
FIG. 12 illustrates the structure of FIG. 11 after polishing.

Act 74 is polishing. As illustrated in FIG. 12, polishing removes a portion of the dielectric 114, exposes a portion of the copper features 112, and planarizes the copper features 112 and the dielectric 114.

Figure 15:
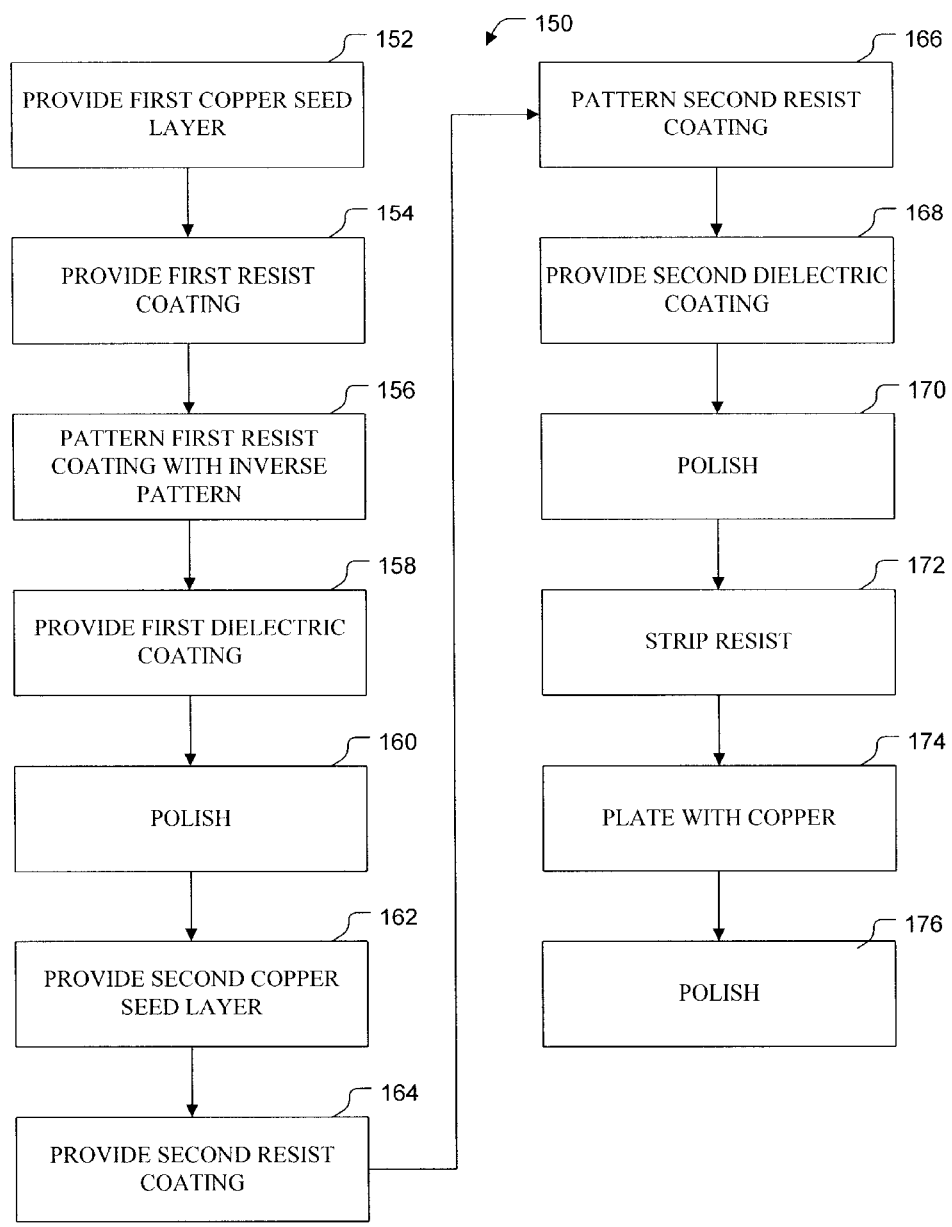
FIG. 15 is a flow chart of a process for forming copper features according to another aspect of the present invention.

FIG. 15 is a flow chart of a process 150 according to another aspect of the present invention. In process 150, the copper features are grown by plating from a copper seed layer within openings defined by first and second dielectric layers. There are several options for providing the copper seed layer, as in process 50. Polishing planarizes the second dielectric layer and the copper features. As with process 50, process 150 can be carried out without the need for a dielectric or metal etching step.

Figure 16:
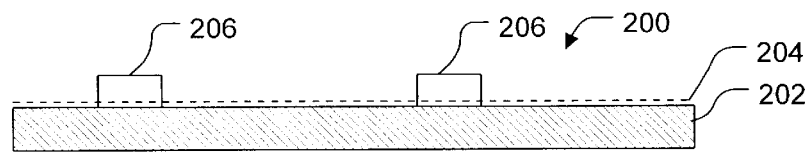
FIG. 16 illustrates a first patterned resist and a copper seed layer over a semiconductor substrate.

Process 150 begins with act 152, which is an optional act of providing a first copper seed layer. Act 154 is coating the substrate, and the first copper seed layer, where present, with a first resist coating. Act 156 is patterning the first resist coating. This action is similar to action 56 of process 50 except that the pattern employed in act 156 is approximately the inverse of the pattern that employed in action 56 of process 50. Thus, act 156 provides a structure such as that illustrated in FIG. 16, wherein device 200 includes substrate 202, first copper seed layer 204, and first patterned resist 206.

Particularly where first copper seed layer 204 forms a continuous layer, it can be desirable to remove the exposed portions of first copper seed layer 204 at this time. Removal can be accomplished by wet etching, for example.

Figure 17:
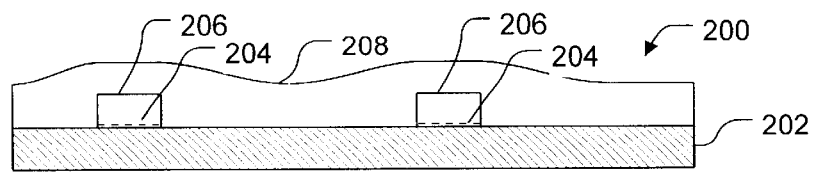
FIG. 17 illustrates the structure of FIG. 16 after coating with a first dielectric layer.

Act 158 is coating the substrate and the first patterned resist with a first dielectric layer. Act 158 results in a structure such as illustrated in FIG. 17, wherein first dielectric layer 208 covers first patterned resist coating 206 and substrate 202.

Figure 18:
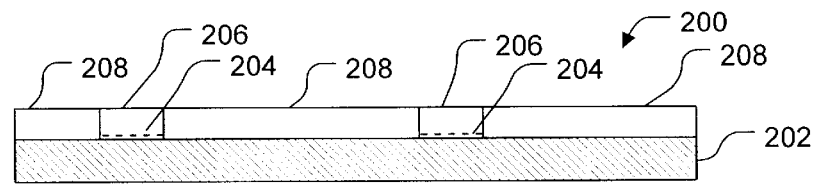
FIG. 18 illustrates the structure of FIG. 17 after polishing.

Act 160 is polishing. Polishing planarizes the first dielectric layer and the first patterned resist layer to produce a structure such as illustrated in FIG. 18. After polishing, the first dielectric layer forms a pattern that is approximately the inverse of the pattern formed by the first resist coating.

Act 162, which is optional, is forming a second copper seed layer over the first dielectric layer. Optionally, the first patterned resist is stripped first, in which case the second copper seed layer can coat the openings previously occupied by the first patterned resist and consequently, act 152, forming the first copper seed layer, can potentially be omitted.

Figure 19:
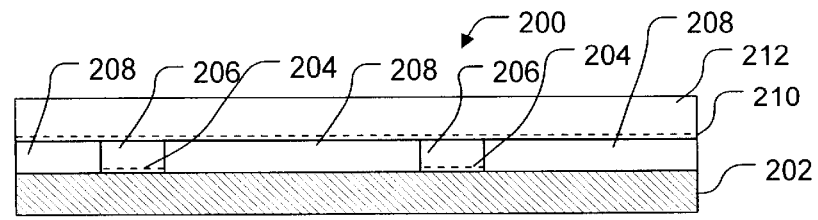
FIG. 19 illustrates the structure of FIG. 18 after coating with a second resist layer.

Act 164 is coating with a second resist resulting in a structure such as illustrated in FIG. 19, wherein second copper seed layer 210 and second resist layer 212 cover first patterned resist coating 206 and first dielectric layer 208. In contract to process 50, the stability of the first patterned resist is generally not a major concern when selecting a material for the second resist in process 150. Thus, any suitable resist can generally be used for the second resist layer, including a resist that is identical to that used in the first resist layer. Optionally, the first resist layer is stripped prior to applying the second resist layer, in which case the second resist layer occupies the space previously occupied by the first patterned resist.

Figure 20:
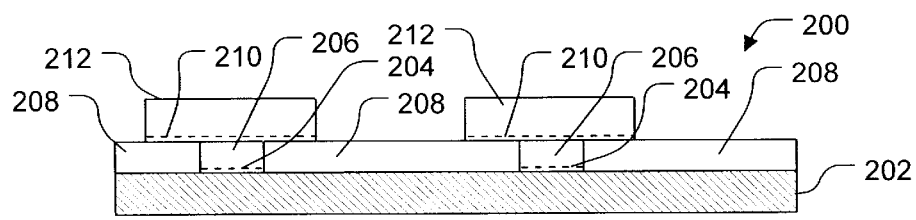
FIG. 20 illustrates the structure of FIG. 19 after patterning the second resist layer.

Act 166 is patterning the second resist layer to produce a structure such as illustrated in FIG. 20. The exposed portion of second copper seed layer 210 is optionally removed at this time by wet etching. In contrast to process 50, the pattern of the second resist in process 150 generally covers the pattern of the first resist. Thus, it is not difficult to avoid damaging the first patterned resist while applying and patterning the second resist layer in process 150.

Figure 21:
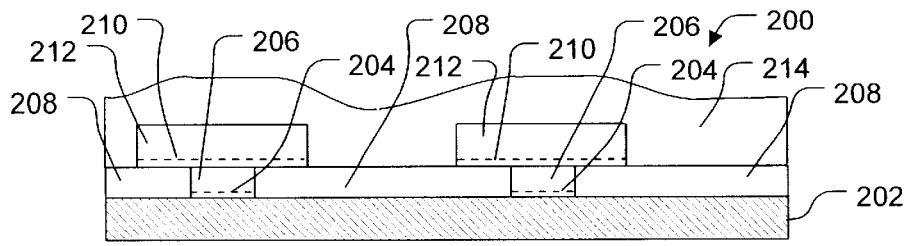
FIG. 21 illustrates the structure of FIG. 20 after coating with a second dielectric layer.

Act 168 is providing a second dielectric coating. The second dielectric coating covers the second patterned resist and the exposed portion of the first dielectric coating. FIG. 21 provides an example of the resulting structure. In FIG. 21, second dielectric layer 214 covers second patterned resist coating 212 and first dielectric layer 208.

Figure 22:
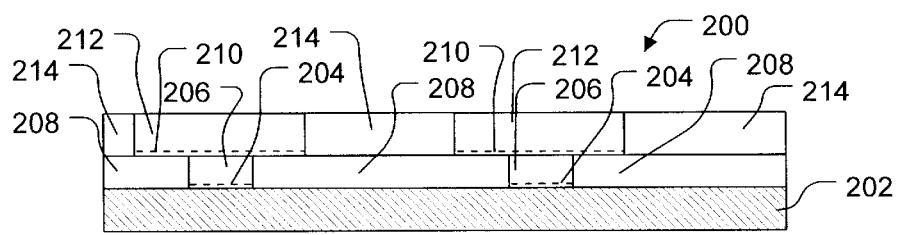
FIG. 22 illustrates the structure of FIG. 21 after polishing.

Act 170 is polishing. Polishing planarizes the second patterned resist and the second dielectric layer to produce a structure such as illustrated in FIG. 22. After polishing, the resist layers occupy space wherein copper features are desired and the first and second dielectric layers form a dual damascene structure.

Figure 23:
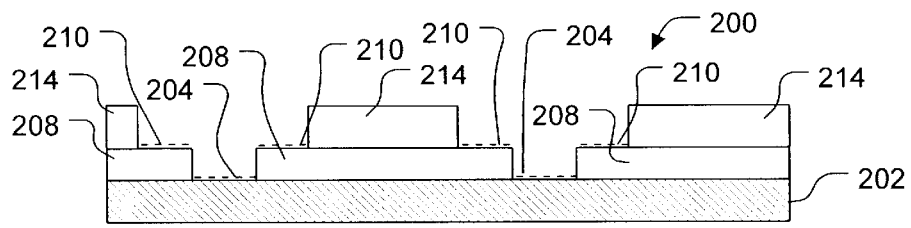
FIG. 23 illustrates the structure of FIG. 22 after stripping the resists.

Act 172 is stripping the second patterned resist, and the first patterned resist if it has not been previously stripped. Stripping exposes portions of any copper seed layers previously formed and produces a structure such as illustrated in FIG. 23. Optionally, the dielectric layers can be trimmed at this point to increase line widths. Also, a copper seed layer can be provided at this time within the openings in the dielectric layers. Such a copper seed layer is coated over the second dielectric layer and exposed portions of the first dielectric layer and the substrate. Copper seed on top of the second dielectric coating is removed to restrict the copper seed layer to the openings defined by the dielectric layers.

Figure 24:
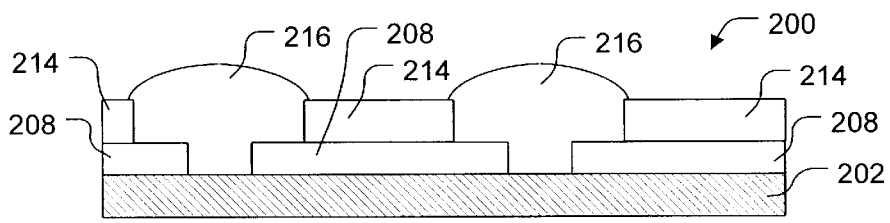
FIG. 24 illustrates the structure of FIG. 23 after plating with copper.

Act 174 is plating to form copper features within the openings defined by the first and second dielectric layers. An example of the resulting structure is illustrated in FIG. 24, wherein copper feature 216 fill and overflow openings in first dielectric layer 208 and second dielectric layer 214.

Figure 25:
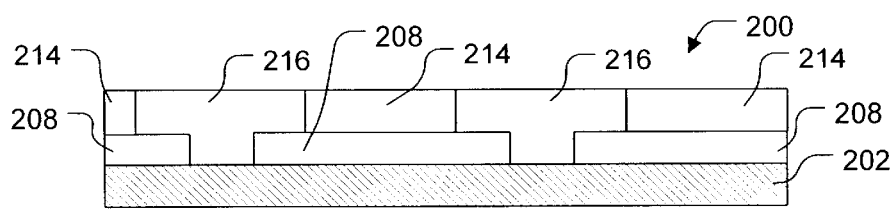
FIG. 25 illustrates the structure of FIG. 24 after polishing.

Act 176 is an optional step of polishing. Polishing an be used to planarize the copper features and the second dielectric layer. An example of the resulting structure is illustrated in FIG. 25.

Figure 26:
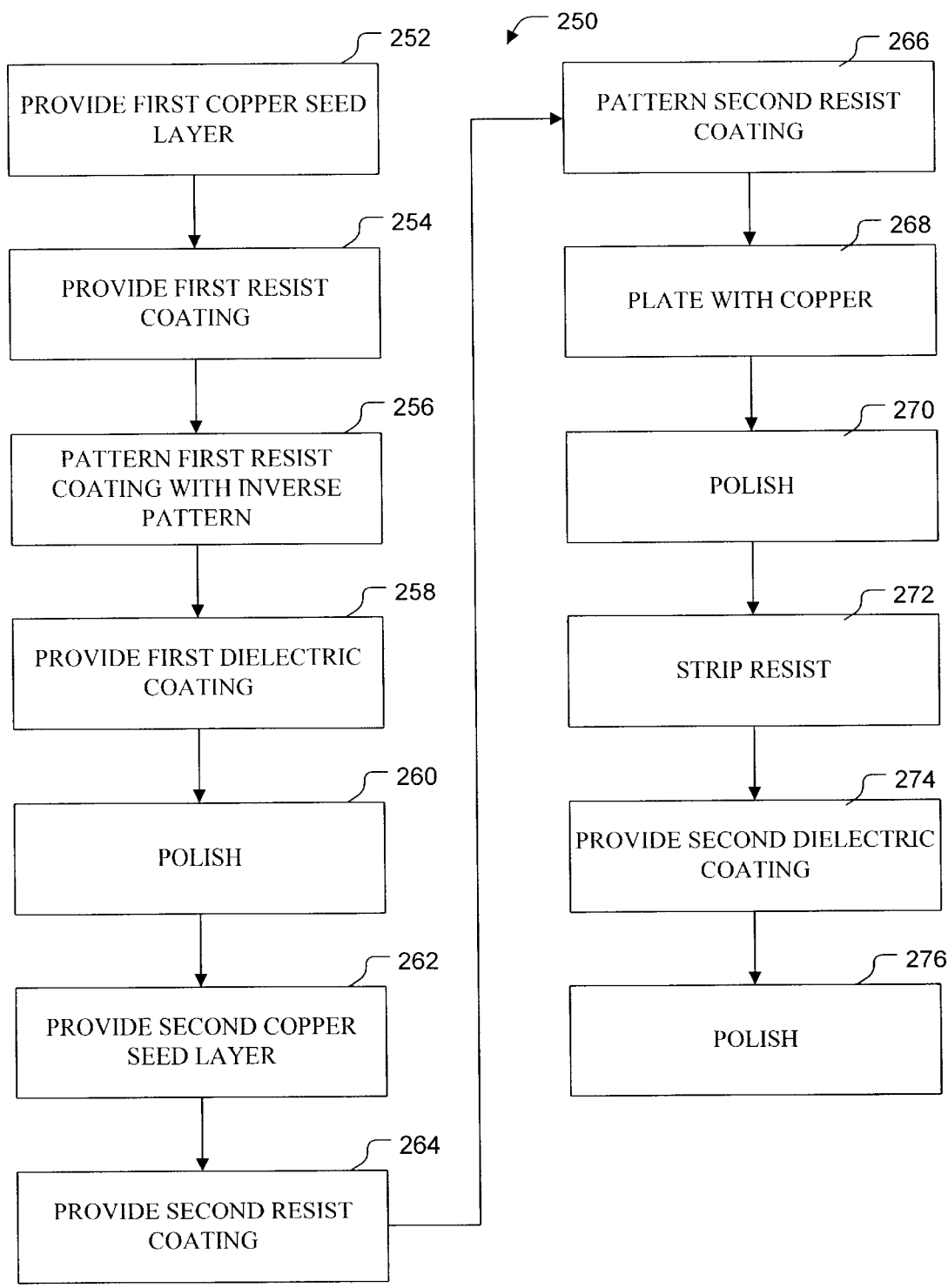
FIG. 26 is a flow chart of a process for forming copper features according to a further aspect of the present invention.

FIG. 26 is a flow chart for a process 250 according to another aspect of the present invention. In process 250, the copper features are grown by plating from a copper seed layer within openings defined by a first dielectric layer and an overlying patterned resist layer. There are several options for providing the copper seed layer, as in process 50. Once the copper features are formed, the overlying resist is stripped and the copper features are coated with a second dieletric layer. Polishing planarizes the second dielectric layer and the copper features. As with process 50, process 250 can be carried out without the need for a dielectric or metal etching step.

Process 250 includes act 252, optionally providing a first copper seed layer, act 254, providing a first resist coating act 256, patterning the first resist coating, act 258, providing a first dielectric coating, act 260, polishing to planarize the first dielectric coating and the first resist coating, act 262, optionally providing a second copper seed layer, and act 264, providing a second patterned resist coating. These acts are generally the same as acts 152, 154, 156, 158, 160, 162, 164 of process 150 and produce a structure such as illustrated in FIG. 19.

Figure 27:
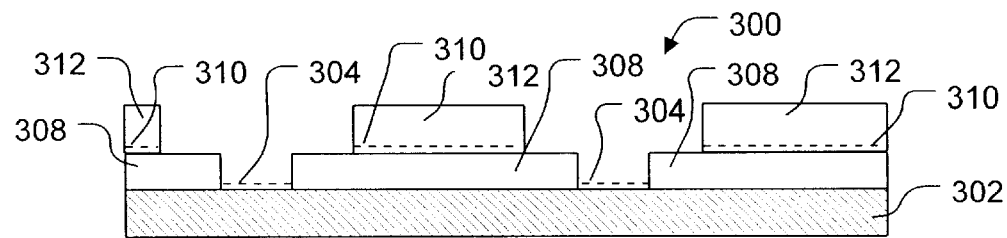
FIG. 27 illustrates a structure, like that of FIG. 19, after patterning the second resist.

Act 266 is patterning the second resist coating. Patterning is conducted by a similar method to that employed in act 166 of process 150, but a pattern that is approximately the inverse of the pattern that would be employed in process 150 is used in process 250. Thus act 266 provides a structure such as that illustrated with device 300 in FIG. 27. Device 300 includes substrate 302, first copper seed layer 304, dielectric layer 308, second copper seed layer 310, and patterned second resist layer 312. Before, during, or after patterning the second resist coating, the first resist coating is stripped. The first patterned resist can be treated prior to forming the second resist coating to facilitate stripping. For example, a positive tone first patterned resist can be given a blanket exposure to actinic radiation.

Figure 28:
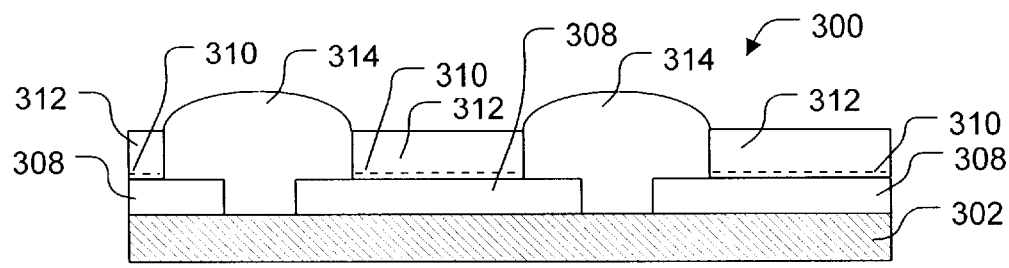
FIG. 28 illustrates the structure of FIG. 27 after plating with copper.

Act 268 is plating to grow copper features from the copper seed layer. Optionally, the first dielectric layer and or the second patterned resist can be trimmed prior to plating to increase line widths. Where, a copper seed layer was not previously provided, one can be provided prior to plating. Such a copper seed layer is coated over the second patterned resist and exposed portions of the first dielectric layer and the substrate. Copper seed layer on top of the second patterned resist is removed to restrict the copper seed layer to the openings defined by the second patterned resist and the first dielectric layer. Plating causes copper feature to grow within these openings and results in a structure such as illustrated in FIG. 28. In FIG. 28, copper features 314 fill and overflow openings defined by first dielectric layer 308 and second patterned resist 312.

Figure 29:
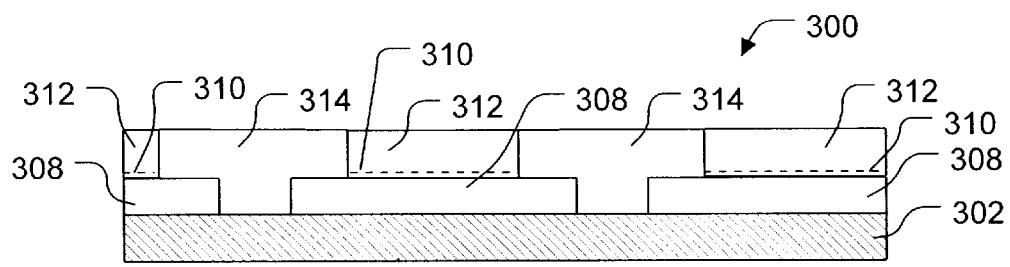
FIG. 29 illustrates the structure of FIG. 28 after polishing.
Figure 30:
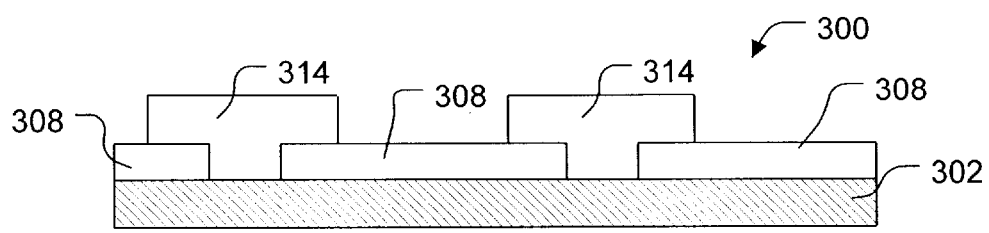
FIG. 30 illustrates the structure of FIG. 29 after stripping the second patterned resist

Act 270 is optionally polishing to planarize the copper features and the second patterned resist. FIG. 29 illustrates an example of the resulting structure when act 314 is employed. Act 272 is stripping the second patterned resist and results in a structure such as illustrated in FIG. 30. The exposed portion of second copper seed layer 310 over first dielectric layer 308 is optionally removed at this time by wet etching. The exposed portions of the copper feature are optionally coated with a diffusion barrier layer forming material prior to further processing.

Figure 31:
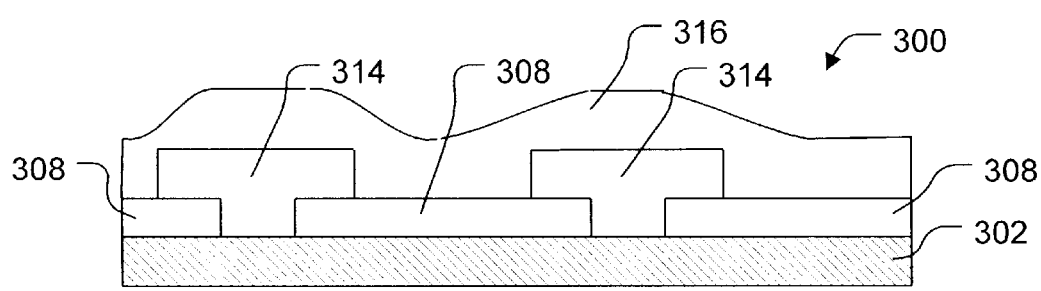
FIG. 31 illustrates the structure of FIG. 30 after coating with a second dielectric layer.

Act 274 is applying a second dielectric coating. An example of the resulting structure is illustrated in FIG. 31, wherein second dielectric layer 316 coats first dielectric layer 308 and copper features 314.

Figure 32:
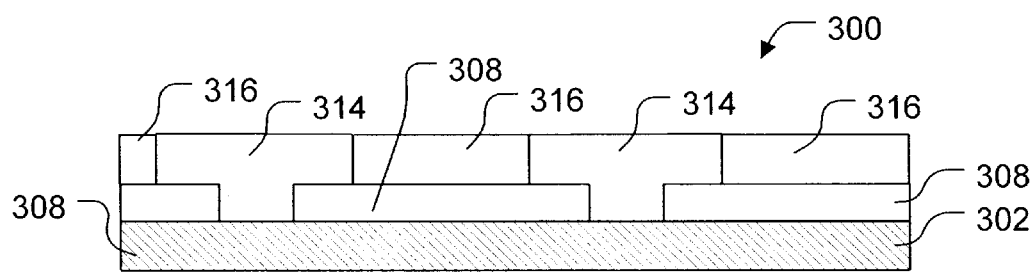
FIG. 32 illustrates the structure of FIG. 31 after polishing.

Act 278 is polishing, which is optional. Polishing exposes a portion of copper features 314 and planarizes the second dielectric layer and the copper features. FIG. 32 illustrates the resulting structure.

Although the invention has been shown and described with respect to a certain preferred embodiment or embodiments, it is obvious that equivalent alterations and modifications will occur to those of ordinary skill in the art upon reading and understanding this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application

What is claimed is:

1. A method of forming copper features on a semiconductor substrate, comprising:

coating the substrate with a first resist;

selectively exposing the first resist to actinic radiation;

developing the first resist to form a first patterned resist defining at least a first set of openings;

coating the substrate with a second resist;

selectively exposing the second resist to actinic radiation;
developing the second resist to form a second patterned resist defining a second set of openings through which at least the first set of openings is exposed; and
plating copper to obtain copper features grown from a copper seed layer within the first and second sets of openings, wherein the copper seed layer is obtained by coating the first patterned resist and the second patterned resist with a blanket copper seed layer and removing a portion of the blanket copper seed layer that is outside the first and second set of openings.

2. The method of claim 1, wherein the copper seed layer comprises a first copper seed layer formed over the substrate prior to coating the substrate with the first resist.

3. The method of claim 1, wherein the copper seed layer comprises a second copper seed layer formed over the first resist prior to coating the substrate with the second resist.

4. The method of claim 1, further comprising:
stripping the resist after plating the copper; and
forming a dielectric coating over the substrate and the copper features.

5. The method of claim 4, further comprising polishing to planarize the dielectric coating and the copper features.

6. The method of claim 4, further comprising, prior to coating with the dielectric, coating the copper features with a diffusion barrier forming material.

7. The method of claim 4, further comprising, prior to stripping the resist, planarizing the copper features and the second patterned resist.

8. The method of claim 1, further comprising trimming one or more of the patterned resists prior to plating to increase a line width defined by an opening in one or more of the patterned resists.

9. The method of claim 8, wherein trimming increases the line width by at least about 25%.

10. The method of claim 1, further comprising stabilizing the first patterned resist prior to coating with the second resist.

11. A method of forming copper features on a semiconductor substrate, comprising:
coating the substrate with a first resist;
selectively exposing the first resist to actinic radiation;
developing the first resist to form a first patterned resist defining at least a first set of openings;
coating the substrate with a second resist;
selectively exposing the second resist to actinic radiation;
developing the second resist to form a second patterned resist defining a second set of openings through which at least the first set of openings is exposed;
plating copper to obtain copper features grown from a copper seed layer within the first and second sets of openings;
stripping the resist after plating the copper; and
forming a dielectric coating over the substrate and the copper features.

12. The method of claim 11, wherein the copper seed layer comprises a first copper seed layer formed over the substrate prior to coating the substrate with the first resist.

13. The method of claim 11, wherein the copper seed layer comprises a second copper seed layer formed over the first resist prior to coating the substrate with the second resist.

14. The method of claim 11, wherein the copper seed layer is obtained by coating the first patterned resist and the second patterned resist with a blanket copper seed layer and removing a portion of the blanket copper seed layer that is outside the first and second set of openings.

15. The method of claim 11, further comprising polishing to planarize the dielectric coating and the copper features.

16. The method of claim 11, further comprising, prior to coating with the dielectric, coating the copper features with a diffusion barrier forming material.

17. The method of claim 11, further comprising, prior to stripping the resist, planarizing the copper features and the second patterned resist.

18. The method of claim 11, further comprising trimming one or more of the patterned resists prior to plating to increase a line width defined by an opening in one or more of the patterned resists.

19. The method of claim 18, wherein trimming increases the line width by at least about 25%.

20. The method of claim 11, further comprising stabilizing the first patterned resist prior to coating with the second resist.

21. A method of forming copper features on a semiconductor substrate, comprising:
coating the substrate with a first resist;
selectively exposing the first resist to actinic radiation;
developing the first resist to form a first patterned resist defining at least a first set of openings;
coating the substrate with a second resist;
selectively exposing the second resist to actinic radiation;
developing the second resist to form a second patterned resist defining a second set of openings through which at least the first set of openings is exposed;
plating copper to obtain copper features grown from a copper seed layer within the first and second sets of openings;
stabilizing the first patterned resist prior to coating with the second resist.

22. The method of claim 21 wherein the copper seed layer comprises a first copper seed layer formed over the substrate prior to coating the substrate with the first resist.

23. The method of claim 21, wherein the copper seed layer comprises a second copper seed layer formed over the first resist prior to coating the substrate with the second resist.

24. The method of claim 21, wherein the copper seed layer is obtained by coating the first patterned resist and the second patterned resist with a blanket copper seed layer and removing a portion of the blanket copper seed layer that is outside the first and second set of openings.

25. The method of claim 21, further comprising:
stripping the resist after plating the copper; and
forming a dielectric coating over the substrate and the copper features.

26. The method of claim 25, further comprising polishing to planarize the dielectric coating and the copper features.

27. The method of claim 25, further comprising, prior to coating with the dielectric, coating the copper features with a diffusion barrier forming material.

28. The method of claim 25, further comprising, prior to stripping the resist, planarizing the copper features and the second patterned resist.

29. The method of claim 21, further comprising trimming one or more of the patterned resists prior to plating to increase a line width defined by an opening in one or more of the patterned resists.

30. The method of claim 29, wherein trimming increases the line width by at least about 25%.

* * * * *